United States Patent [19]

Glass et al.

[11] Patent Number: 4,622,114

[45] Date of Patent: Nov. 11, 1986

[54] PROCESS OF PRODUCING DEVICES WITH PHOTOELECTROCHEMICALLY PRODUCED GRATINGS

[75] Inventors: Alastair M. Glass, Rumson; Paul A. Kohl, Chatham; Richard M. Lum, Colts Neck; Frederick W. Ostermayer, Jr., Berkeley Heights, all of N.J.

[73] Assignee: AT&T Bell Laboratories, Murray Hill, N.J.

[21] Appl. No.: 684,022

[22] Filed: Dec. 20, 1984

[51] Int. Cl.⁴ .............................................. C25F 3/12
[52] U.S. Cl. ............................. 204/129.3; 204/129.75
[58] Field of Search ........................ 204/129.3, 129.75

[56] References Cited

U.S. PATENT DOCUMENTS

| | | | |
|---|---|---|---|
| 3,706,645 | 12/1972 | Lasser | 204/129.3 |
| 4,351,706 | 9/1982 | Chappell et al. | 204/129.75 |
| 4,369,099 | 1/1983 | Kohl et al. | 204/129.3 |
| 4,389,291 | 6/1983 | Kohl et al. | 204/129.3 |
| 4,404,072 | 9/1983 | Kohl et al. | 204/129.3 |
| 4,414,066 | 11/1983 | Forrest et al. | 204/129.3 |
| 4,415,414 | 11/1983 | Burton et al. | 204/129.3 |
| 4,482,442 | 11/1984 | Kohl et al. | 204/129.3 |
| 4,482,443 | 11/1984 | Bacon et al. | 204/129.3 |

FOREIGN PATENT DOCUMENTS

| | | | |
|---|---|---|---|
| 1193335 | 8/1954 | Fed. Rep. of Germany | 204/129.3 |
| 2382523 | 11/1978 | France | 204/129.3 |
| 1535061 | 12/1978 | United Kingdom | 204/129.3 |

OTHER PUBLICATIONS

Tenne et al., "Appl. Phys. Lett." 37(4), 15 Aug. 1980, pp. 428-430.
H. Kogelnik et al., "Stimulated Emission in a Periodic Structure," *Applied Physics Letters,* 18(4) 152-154 (Feb. 1971).
T. Matsuoka et al., "CW Operation of DFB-BH GaInAsP/InP Lasers in 1.5 μm Wavelength Region," *Electronics Letters,* 18(1) 27-28, (Feb. 1971).
S. Akiba et al., "Low-Threshold-Current Distributed-Feedback InGaAsP/InP CW Lasers," *Electronics Letters,* 18 77-78 (1982).
M. J. Beesley et al, "The Use of Photoresist as a Holographic Recording Medium," *Applied Optics,* 9 (12) 2720-2724 (Dec. 1970).
L. F. Johnson et al, "Generation of Periodic Surface Corrugations," *Applied Optics,* 17(8) 1165-1181 (Apr. 1978).
L. D. Westbrook et al, "High-Quality InP Surface Corrugations for 1.55 μm InGaAsP DFB Lasers Fabricated Using Electron-Beam Lithography," *Electronics Letters,* 18(20) 863-865 (Sep. 1982).
H. L. Garvin et al, "Ion Beam Micromachining of Integrated Optics Components," *Applied Optics,* 12(3) 455-459 (Mar. 1973).
C. V. Shank et al, "Optical Technique for Producing 0.1-μPeriodic Surface Structures," *Applied Physics Letters,* 23(3) 154-155 (Aug. 1973).
T. Saitoh et al, "New Chemical Etching Solution for InP and GaInAsP Gratings," *Electronics Letters,* 18(10) 408-409 (May 1982).
D. V. Podlesnik et al, "Maskless, Chemical Etching of Submicrometer Gratings in Single-Crystalline GaAs," *Applied Physics Letters,* 43(12) 1083-1085 (Dec. 1983).
L. H. Lin, "Method of Characterizing Hologram-Recording Materials," *Journal of the Optical Society of America,* 61(2) 203-208 (Feb. 1971).
P. Besomi et al, "Enhanced Indium Phosphide Substrate Protection for Liquid Phase Epitaxy Growth of Indium-Gallium-Arsenide-Phosphide Double Heterostructure Lasers," *Journal of Applied Physics,* 54(2), 535-539 (Feb. 1983).

*Primary Examiner*—John F. Niebling
*Assistant Examiner*—Terryence Chapman
*Attorney, Agent, or Firm*—Walter G. Nilsen

[57] ABSTRACT

A photoelectrochemical etching process is described for producing gratings in various semiconductors. Because this is a direct, single step process, extreme uniformity is obtained over a wide area. The procedure is particularly useful for mode reflection in distributed feedback lasers.

17 Claims, 6 Drawing Figures

- CAP LAYER P-InP
- WAVEGUIDE LAYER p-GaInAsP λ=1.3μm
- ACTIVE LAYER n-GaInAsP λ=1.55μm
- BUFFER LAYER n-GaInAsP λ=1.3μm
- SUBSTRATE n-InP

- CAP LAYER p-InP
- n-GaInAsP (SI-InP)
- WAVEGUIDE LAYER p-GaInAsP λ=1.3μm
- ACTIVE LAYER n-GaInAsP λ=1.55μm
- BUFFER LAYER n-GaInAsP λ=1.3μm
- SUBSTRATE n-InP

PROCESS OF PRODUCING DEVICES WITH PHOTOELECTROCHEMICALLY PRODUCED GRATINGS

TECHNICAL FIELD

The invention is a process for fabricating semiconductor structures comprising gratings.

BACKGROUND OF THE INVENTION

The recent development of optical devices of various kinds has led to renewed interest in easy, rapid methods of producing optical gratings of various kinds. Such gratings have a variety of uses including frequency selection, optical feedback-type devices and wavelength dispersion. Reliable methods of making gratings of high quality with close spacing and high sensitivity are highly desirable.

A particular device in which the use of optical gratings is important is the single-frequency semiconductor laser. The development of optical communication systems has led to a variety of laser structures of particular interest. Much of the motivation for this work has been toward increasing the information carrying capacity (bit-rate capacity) of optical fibers. Of particular interest is the fabrication of a single longitudinal mode (or enhanced mode) laser for use in a single mode optical communication system.

A particularly interesting laser structure for single longitudinal mode operation is the distributed feedback (DFB) laser structure. This structure has been described in a number of publications including H. Kogelnik et al, *Applied Physics Letters*, 18(4), 152–154 (1971); T. Matsuoka et al, *Electronics Letters*, 18(1), 27–28 (1982); and S. Akiba et al, *Electronics Letters*, 18, 77–78 (1982).

Current efforts in the production of a single longitudinal mode laser have been centered on the GaInAsP/InP laser in the 1.55 μm wavelength region where silica fibers, exhibit minimum attenuation.

DFB lasers are fabricated by producing a periodic surface corrugation in close proximity to the active region. Feedback occurs by Bragg scattering from the grating corrugations and is thus distributed throughout the laser structure. The lasing wavelength is determined by the period of the DFB grating. For first-order feedback at 1.55 μm in GaInAsP, a grating period of approximately 0.23 μm is required. High uniformity and accurate periodicity are required so as to yield high frequency selectivity and good laser operating characteristics.

A variety of procedures has been used to fabricate the grating corrugations for such lasers. Generally, a photoresist or electron resist mask is used in the fabrication procedure. For example, a holographic or electron beam procedure is used to pattern the resist and an ion milling procedure or chemical etching procedure is used to produce the necessary grating. Such work has been described in a number of references including M. J. Beesley et al, *Applied Optics*, 9(12), 2720–2724 (1970); L. F. Johnson et al, *Applied Optics*, 17(8), 1165–1181 (1978); L. D. Westbrook et al, *Electronics Letters*, 18(20), 863–865 (1982); H. L. Garvin et al, *Applied Optics*, 12(3), 455–459 (1973); C. V. Shank et al, *Applied Physics Letters*, 23(3), 154–155 (1973); and T. Saitoh et al, *Electronics Letters*, 18(10), 408–409 (1982).

Highly desirable in a simpler and more reliable procedure for making highly periodic grating structures at a periodicity useful for commercially valuable lasers. Particularly desirable would be a direct writing procedure which would eliminate the need for a resist to be used. Such a maskless procedure has been discussed in the literature previously (see D. V. Podlesnik et al, *Applied Physics Letters*, 43(12), 1083–1085 (1983)).

SUMMARY OF THE INVENTION

The invention is a process for making a device which includes an optical grating on a surface of a semiconductor compound in which the grating is made by imaging an array of parallel lines of light (usually formed by interference) on the surface and etching with a photoelectrochemical procedure. The procedure applies to n-type and intrinsic semiconductor compounds and applies most particularly to III-V semiconductor compounds. In photoelectrochemical etching the presence of light is required to induce etching. The photoelectrochemical etching procedure involves making the compound semiconductor part of an oxidation-reduction electrochemical process in an electrolytic solution by applying a potential to the compound semiconductor relative to a standard electrode and illuminating the area to be etched with light of sufficient energy to create electron-hole pairs. The bias potential is chosen so that the holes participate in an oxidative decomposition reaction at the surface of the semiconductor. The bias potential of the compound semiconductor (potential of compound semiconductor relative to a reference electrode in the electrolyte) should be between precise limits which depend on the particular compound semiconductor being etched (including the dopant type and concentration) and the composition of the electrolytic solution in which the etching is done. Throughout this work, potentials are expressed with reference to the saturated KCl calomel electrode (SCE). To convert a particular potential from the SCE reference to the standard hydrogen electrode reference, add 0.242 volts. In general, the potential should be between the valence band maximum and the conduction band minimum for the particular compound semiconductor in the particular electrolytic solution being used.

The pattern of light to which the semiconductor surface is exposed is such as to produce a grating on the semiconductor surface. Generally, this pattern of light is made up of parallel lines of light with dark areas between each line. Often, the light intensity varies sinusoidally in the direction perpendicular to the parallel lines of light with the light intensity close to or at zero at the minimum of the sinusoidal curve. Since the rate of etching is proportional to the light intensity, a grating structure is produced.

Various optical devices can be made using the grating produced as described above, including optical filters, optical couplers, etc. A particularly interesting device is the distributed feedback semiconductor laser which exhibits single longitudinal mode operation and is especially suited for use in high bit rate, long haul optical communication systems. Also of interest is the possible use in wavelength multiplexing in optical communication systems.

DETAILED DESCRIPTION

The invention is based on the discovery that photoelectrochemical etching is particularly suited to producing gratings on compound semiconductor surfaces by direct illumination and without the use of a mask. Such direct processing has numerous advantages particularly in commercial manufacturing of devices because one of the critical steps in the process (photoresist exposure and development) is eliminated. The grating structure is useful in a variety of applications including use as a dispersion medium in a light spectrometer, as a coupling device in a light communication system, and as a filtering device in a light communication system. A particularly interesting application is to a distributed feedback (DFB) semiconductor laser. This type of laser is largely used to produce a single frequency laser for optical communication systems.

The procedure for producing the gratings may be outlined as follows: first, the semiconductor surface is illuminated with light suitable to inducing photoelectrochemical etching in the semiconductor and with a pattern which will result in a grating structure. Suitable light for photoelectrochemical etching is discussed below. A suitable pattern to produce a grating structure usually involves an array of parallel lines of light with dark (parallel) regions between the parallel lines of light. Although the variation in light intensity perpendicular to the parallel lines of light may be of various forms, a close to sinusoidal spatial variation in intensity is often used with the minimum in the sine variation close to complete absence of light.

Generally, this procedure for making gratings is attractive where the spacing between grating lines (period of the grating) is very small. Therefore, the period of the light pattern illuminating the semiconductor surface should be less than about 10 $\mu$m or even 5 $\mu$m. Indeed, the procedure is extremely attractive for extremely small spacings (less than about 1.0 $\mu$m or about 0.5 $\mu$m). A period of about 0.5 $\mu$m corresponds to second order feedback in GaInAsP of a wavelength of 1.55 $\mu$m.

A particularly convenient way of producing the desired light pattern on the surface of the compound semiconductor is by the use of well-known holographic techniques. For example, by producing a light interference pattern on the surface of the semiconductor, a suitable spatial intensity variation is obtained. Such interference patterns or holographic patterns may be produced in a number of ways well known in the art (see, for example, D. V. Podlesnik et al, *Applied Physics Letters*, 43(12), 1083–1085 (1983) and M. J. Beesley et al, *Applied Optics*, 9(12), 2720–2724 (1970).

Figure 1:
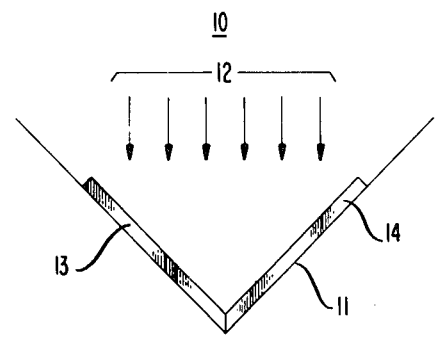
FIG. 1 shows a convenient apparatus arrangement for producing an interference pattern on a surface for producing the grating in accordance with the invention.

A particularly convenient method of producing the desired interference pattern is the use of a corner reflector as is shown in FIG. 1. FIG. 1 shows a particularly convenient experimental arrangement 10 for producing an interference pattern at the semiconductor surface. The arrangement 10 is made up of a corner reflector 11 and a radiation source producing more or less collimated light 12 incident on the corner reflector. The corner reflector 11 is made up of two intersecting planes, one containing a mirror 13 and the other containing the semiconductor surface 14. The radiation arriving at the semiconductor surface directly from the laser and from the mirror form an interference pattern, the spacing of which depends on laser frequency and angle between the parallel radiation and corner reflector and the refractive index of the electrolyte.

The photoelectrochemical etching procedure may be carried out on n-type compound semiconductors or intrinsic compound semiconductors although n-type semiconductors are preferred because of greater resolution in the etching process. The photoelectrochemical etching procedure has been described in a number of references including U.S. Pat. No. 4,414,066 issued to S. R. Forrest et al on Nov. 8, 1983; U.S. Pat. No. 4,404,072 issued to P. A. Kohl et al on Sept. 13, 1983; U.S. Pat. No. 4,482,443 issued to D. E. Bacon et al on Nov. 13, 1984; and U.S. Pat. No. 4,389,291 issued to P. A. Kohl et al on June 21, 1983.

The procedure involves making the semiconductor part of an oxidation-reduction electrochemical process in an electrolytic solution by applying a potential to the semiconductor relative to a standard electrode and illuminating the area to be etched with light of sufficient energy to create electron-hole pairs in the semiconductor. The bias potential is chosen so that the holes participate in an oxidative-decomposition reaction at the surface of the semiconductor. The bias potential of the compound semiconductor (potential of compound semiconductor relative to a reference electrode in the electrolyte) should be between precise limits which depend on the particular compound semiconductor being etched (including dopant type and concentration) and the composition of the electrolytic solution in which the etching is done. Throughout this work, potentials are expressed with reference to the saturated KCl calomel electrode (SCE). To convert a particular potential from the SCE reference to the standard hydrogen electrode reference, add 0.242 volts. In general, the potential should be between the valence band maximum and the conduction band minimum for the particular compound semiconductor in the particular electrolytic solution being used.

The rate of etching is proportional to the intensity of light in the interference pattern. Various light sources may be used provided the photon energy is sufficient to create holes in the valence band. Convenient light sources are various lasers such as the He-Ne laser ($\lambda=0.6328$ $\mu$m), the Argon laser ($\lambda=0.5145$ or $0.4880$ $\mu$m) and the He-Cd laser ($\lambda=0.4416$ $\mu$m).

The procedure can be used with a variety of compound semiconductors including III-V compound semiconductors and II-VI compound semiconductors. Typical semiconductors are CdS, CdSe, HgCdTe, GaP, GaAs, AlAs, AlP, AlSb, InSb, InAs, InP, GaInAs, GaInP, GaInAsP, GaAlP and GaAlAs. Some semiconductors may be epitaxially grown on various substrates including substrates made of other compound semiconductors (e.g., InGaAs or InGaAsP on InP or AlGaAs on GaAs). Both intrinsic and n-type materials may be used by the inventive process. Intrinsic semiconductors refer to a class of semiconductors where the number of holes and electrons are nearly equal (usually within a factor of 100).

Preferred compound semiconductors are InP and GaAs and semiconductor compounds that can be lattice matched to these compounds (e.g., InGaAs and InGaAsP for InP and GaAlAs for GaAs). The preference is based on the high quality of substrates made of InP and GaAs and the well-developed technology for making optical devices (e.g., semiconductor lasers) using InP and GaAs as substrates.

Intrinsic semiconductors include undoped semiconductors and semiconductors doped with traps to compensate for impurities or other dopants. Typically, such semiconductors are semi-insulating with resistivities greater than $10^6$ ohm-cm. In some instances, resistivities are greater than $10^7$ or even $10^8$ ohm-cm. Often, such materials are useful for substrates because of their semi-insulating characteristics.

Also included are n-type compound semiconductors where electrons exceed holes. Usually n-type semiconductors are obtained by doping with donors (i.e., sulfur, selenium or tellurium) for Group V elements or silicon for Group III elements. Typical doping levels are $10^{15}$ to $10^{19}$ atoms per cubic centimeter, with $10^{17}$ to $10^{19}$ atoms per cubic centimeter preferred for many applications. The process is useful on compound semiconductors where radiation of a particular energy has a significant effect on the hole carrier population in the valence band. In general, this means hole carrier population should not exceed electron carrier population in the unirradiated compound semiconductor by more than a factor of 100.

As stated above, the compound semiconductor is made part of an oxidation-reduction electrochemical process with the compound semiconductor made the anode and an inert material made the counter-electrode or cathode. Typically, the cathode is an inert metal such as platinum or platinized titanium although a wide variety of materials may be used.

An electrical power source (battery or electronic power supply) is used to adjust the potential on the compound semiconductor to a range to be discussed below and to supply power for the oxidation-reduction reaction. In addition, a standard electrode (usually an SCE electrode) is used to measure the potential on the compound semiconductor. Most convenient is the use of a potentiostat to control the potential applied to the compound semiconductor.

The potential on the compound semiconductor to be photoetched is particularly important because too high a potential will lead to etching in the absence of radiation and too low a potential will prevent any etching even in the presence of radiation. As a general criteria, the potential should be between the maximum potential of the valence band in the particular electrolytic solution being used and the minimum potential of the conduction band under these same conditions. Often these various potentials are known or can be found from various literature references. Typical values for n-type InP are −0.5 to +1.0 with a preferred range of −0.1 volts to +0.5 volts on the SCE scale in one molar hydrochloric acid with about +0.2 volts most preferred for etching. For n-type GaAs, the range is −0.7 to +1.0 with a preferred range of −0.4 to +0.4 volts again in hydrochloric acid with about 0.0 volts most preferred for etching. Generally, the preferred potentials may vary about ±0.1 volts. Generally, these potentials shift negatively about 60 millivolts per pH unit in going from acidic to basic solution.

More accurately, the potential should be between the valence band maximum and the flat band potential. The maximum range for the potential is where the flat band potential is close to or equal to the conduction band minimum as is the case for n-type materials. For intrinsic materials, the flat band potential is near the center of the band gap.

Where the relevant potentials are not known or where more accurate potentials are desired, a direct measurement of these quantities can be made by taking a voltammogram of the particular compound semiconductor. Here the current in a typical electrochemical setup described above is measured as a function of the potential applied to the compound semiconductor. This is done both with and without radiation. It is found that in one region of potential, high etching rates are observed (as evidenced by high currents) with radiation and essentially no etching (near zero current) without radiation. It is this region of potential which is of interest in the electrochemical photoetching process. The potential where etching occurs without radiation is at the valence band potential maximum; the potential where etching starts to occur with radiation is approximately the conduction band minimum for n-type materials. For intrinsic materials, the potential is the flat band potential located usually halfway between the valence band maximum and conduction band minimum.

The procedure for producing gratings depends on the fact that etching rate is proportional to light intensity. Generally, the energy of the radiation should be great enough to create holes in the valence band. Theoretically, the photon energy of the radiation should be at least as great as the band gap of the semiconductor. In some cases, less energy can be used because of occupied states (due to impurities, doping elements, compensation elements, crystal imperfections, etc.) in the band gap. Generally, radiation energy greater than the band gap is preferred so that the absorption (and therefore the holes created) takes place near the surface where they can participate in the etching process.

A particularly important part of the invention is the nature and composition of the electrolytic solution. A general requirement for the electrolytic solution is that it be sufficiently conductive to permit reasonable electrochemical photoetch rates. Generally, a conductivity greater than 0.0001 mhos/cm is sufficient to meet this requirement; greater than 0.01 mhos/cm is preferred. Although this requirement may be met by the introduction of salts such as potassium nitrate, etc., it is usually met by the presence of other chemicals used to remove the oxidation products of the compound semiconductor being etched.

Another requirement easily stated but less easily put in practice is that the electrolytic solution should not interfere in a detrimental way with the oxidation-reduction electrochemical reaction or the irradiation procedure. Generally, this indicates that the components of the electrolytic solution not be subject to oxidation at the potentials at any of the electrodes and not be opaque (i.e., not excessively absorb) the radiation used in the process. Under special conditions, it might be convenient or advantageous to introduce a mild oxidizing agent to the electrolytic solution so that reduction at the cathode takes place more easily. A similar situation might be obtained for a mild reducing agent but for the most part stability to the electrochemical conditions at the anode (semiconducting material) and cathode (counter-electrode) is preferred. In general, the reduction at the cathode involves the reduction of water to form hydrogen gas.

For example, a number of acids might be used in the practice of the invention but generally the acids $HNO_3$ and HI would be avoided because of the possibility of reducing $HNO_3$ or oxidizing HI.

The most critical requirement of the electrolytic solution is that it removes the oxidation products of the photoetching process rapidly and in such a way as to not limit the etching rate. Although high solubility of these oxidation products is certainly important, it is believed that near equality (and perhaps rapidity) in the dissolution rate of the various oxidized species is highly desirable. Both acids and bases may be used to accomplish this end, generally with pH values less than 5 or greater than 9. Preferably, the pH should be less than 3 or greater than 11 because of faster rates obtained. Various acids may be used including HCl, HBr, HF, and $H_2SO_4$. These acids are generally stable in the electrochemical atmosphere of the etching process. The alkaline solutions are usually made by the addition of alkaline agents such as sodium hydroxide or potassium hydroxide. Chelating agents may also be useful in insuring rapid removal of the oxidation products of the etching procedure and may also be used to change the potential of the conduction band minimum and valence band maximum.

Preferred conditions for the photoelectrochemical etching process depend on obtaining well-defined gratings with close spacings for use in the visible and near infrared regions. Excellent results are obtained in acid solutions, particularly strong acids such as $H_2SO_4$, HBr, and HCl. Preferred in aqueous $H_2SO_4$, particularly when growth on top of the grating is contemplated.

Acid concentrations between 0.05 and 10 molar are useful. Higher concentrations generally produce better gratings particularly for close spacings. Concentrations from 1–5 molar generally yield excellent results. Sulfuric acid solutions with or without oxidizing agent are particularly useful for InP and III-V compound semiconductors lattice matched to InP (e.g., GaInAs, GaInAsP, etc.).

In the direct etching of fine gratings, the spatial resolution of the etching process is important. The resolution can be characterized by the ratio of the amplitude of the grating produced to the average depth etched. The smaller this quantity is the more deeply the surface must be etched to form a grating having a desired amplitude. Deep etching of the surface is generally undesirable. Surface roughness increases with the depth of etching. Also the deeper the etching the more likely that defects in the material will be revealed that will lead to nonuniform etching. It will also make it very difficult to form a grating in a thin epitaxial layer that has been grown over the active region of a laser structure.

A number of experiments were carried out to determine the effect of various process parameters on spatial resolution of the etching process. The resolution was measured by monitoring the diffraction efficiency of the grating as it was being formed and calculating a quantity called the holographic sensitivity (L. H. Lin, *Journal of the Optical Society of America*, 61, 203 (1971). This quantity is proportional to the ratio of the amplitude of the grating to the average depth etched. When the spatial frequency of the grating is small, the holographic sensitivity reaches a maximum value corresponding to this ratio having a value of unity. As the spatial frequency of the grating is increased, the holographic sensitivity decreases.

At the spatial frequency needed for a particular application, it is desirable to maximize the holographic sensitivity.

Experiments were carried out on a number of different materials, including undoped InP ($n_p = 3 \times 10^{15} cm^{-3}$), S-doped n-type InP($n_p = 6 \times 10^{18} cm^{-3}$), undoped GaInAsP ($n_p = 5 \times 10^{16} cm^{-3}$) and Sn-doped n-type GaInAsP ($n_p = 1 \times 10^{18} cm^{-3}$). These experiments were carried out in a number of electrolytic solutions, at various radiation wavelengths between 0.442 and 0.633 $\mu m$ and at various power levels between 1 and 350 $mW/cm^2$.

The experiments were carried out on the (100) surface. The applied potential was between 0.2 and 0.5 volts versus a saturated calomel electrode. A laser interferometer arrangement was used to produce the interference pattern needed to produce the grating. This interference pattern was essentially a sinusoidal variation in irradiance at the sample surface. A monitoring system was used to observe the growth of the grating with time.

Excellent results were obtained for grating periods of 8.5 $\mu m$ and 1.5 $\mu m$. The more heavily doped material yielded particularly good results. Equally good results were obtained for the various radiation wavelength used in these experiments. Also, the various power levels used yielded equally good results.

For many grating applications, short grating periods (e.g., less than 1 $\mu m$) are required. Here, high holographic sensitivities are more difficult to obtain are careful choice of electrolyte is important. Particularly useful is aqueous HBr, HCl, and $H_2SO_4$. Higher concentrations of acid lead to higher holographic sensitivites. For example, increase in the concentration of sulfuric acid from 1:100 to 1:10 $H_2SO_4:H_2O$ improved the holographic sensitivity by nearly a factor of 100. High reaction rates appear to improve the resolution of the etching process for short-period gratings. The addition of oxidizing agents may also be useful in certain situations.

Figure 2:
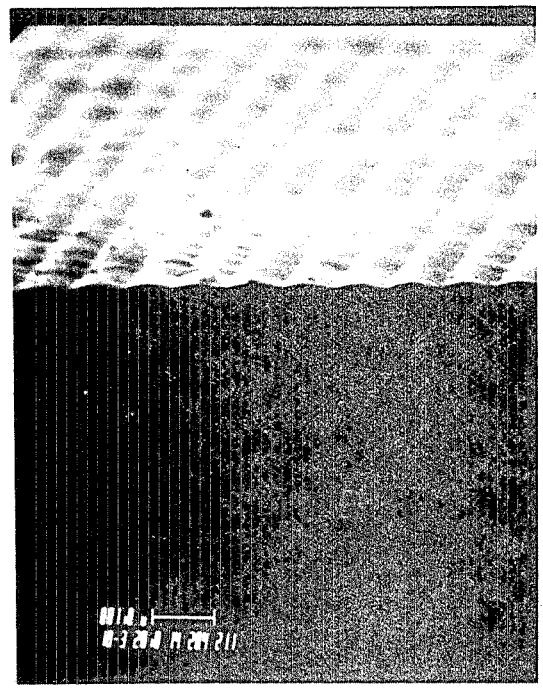
FIG. 2 shows a grating on an n-InP substrate made in accordance with the invention.

FIG. 2 shows a scanning electron photomicrograph of a grating on n-type InP made in accordance with the invention.

Diffraction grating can be used in a variety of devices and for a variety of purposes. Traditional use is in optical spectrometers as a means of separating various wavelengths of optical radiation.

Figure 3:
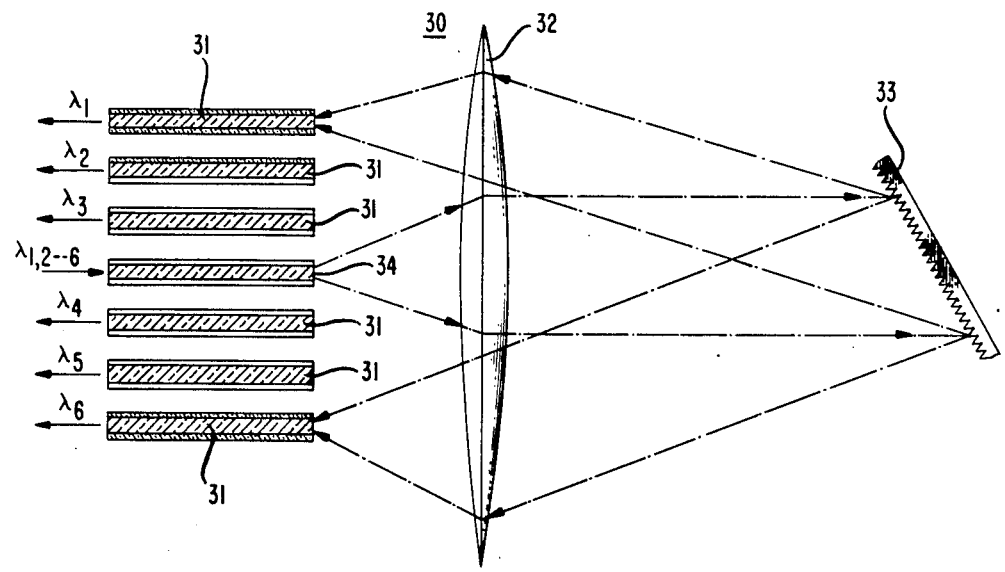
FIG. 3 shows a schematic diagram of a wavelength division multiplexer/demultiplexer with grating made in accordance with the invention.

There are a number of devices which are useful in modern optical communication systems. A typical example is a wavelength division multiplexer/demultiplexer which makes use of a reflection-type diffraction grating made in accordance with the invention. A typical device 30 is shown schematically in FIG. 3. A number of optical communication fibers are shown, one fiber 34 transmitting incoming signals made up of six channels with wavelengths $\lambda_1, \lambda_2, \lambda_3, \lambda_4, \lambda_5$ and $\lambda_6$. The radiation from this fiber 34 is processed through a lens 32 and imaged on a grating 33 which disperses the various channels so that they are imaged back on the six outgoing fibers 31-1, -2, -3, -4, -5 and -6. In this way, the various channels being carried on one fiber 34 are separated onto individual fibers. This is usually referred to as an optical demultiplexer. Multiplexing may be accomplished by reversing the direction of the optical radiation signals. Here, incoming signals on fibers 31-1, -2, -3, -4, -5 and -6 are focused through the lens 32 onto the grating and each channel with wavelengths $\lambda_1$, $\lambda_2$, $\lambda_3$, $\lambda_4$, $\lambda_5$ and $\lambda_6$ is focused back onto fiber 34. In this way, the various channels are superimposed onto the one fiber 34.

A particularly interesting device made in accordance with the invention is a distributed feedback semiconductor laser. The diffraction grating in the laser structure is located close to the active region and produces feedback for only one of the modes (frequencies) of the laser. Single-mode laser application is of interest in a wide variety of applications including second-harmonic generation, optical communications, etc.

Figure 4:
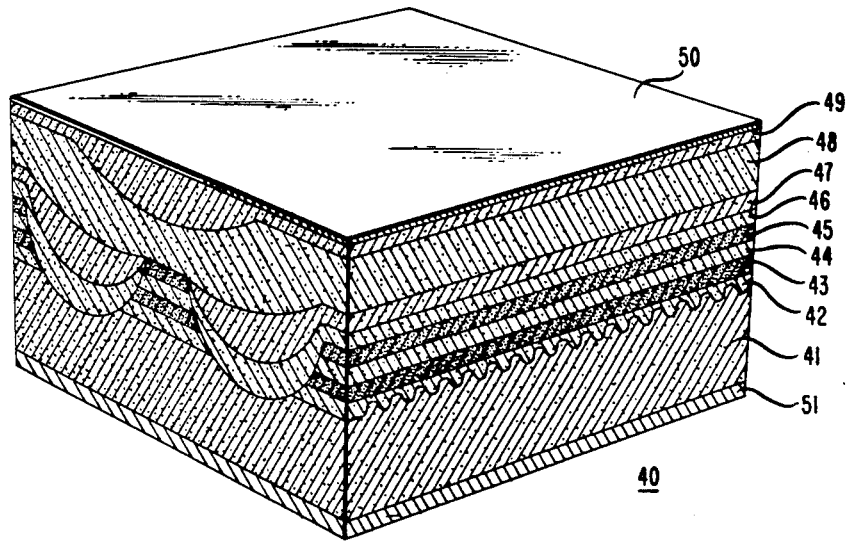
FIG. 4 shows a view of a distributed feedback semiconductor laser with grating in the substrate made in accordance with the invention.

For optical communications, particular interest centers on lasers in the long wavelength region (e.g., 1.55 $\mu$m). A typical structure for such a laser is shown in FIG. 4. This Figure shows a diagram of a distributed feedback-double channel planar buried heterostructure laser 40 fabricated to operate at 1.55 $\mu$m. It is made up of a substrate 41 made of n-InP into which the grating has been etched. Covering the grating is a waveguiding layer 42 made of n-type InGaAsP with composition such that its bandgap corresponds to a radiation wavelength of 1.3 $\mu$m. This layer 42 planarizes the wafer and has a thickness of approximately 0.15 $\mu$m. Next is an undoped layer 43 of 1.55 mm InGaAsP with a thickness of approximately 0.15 $\mu$m. This serves as the active layer in the device. The active layer is covered with another layer 44 of 1.3 $\mu$m p-type InGaAsP which serves as a waveguide layer and an anti-meltback layer. It has a thickness of about 0.15 $\mu$m. These layers are followed by successive layers of p-InP 45, p-InP 46, n-InP 47, a thick layer of p-InP 48 and a top layer of p-InGaAs 49. Metal layer electrodes (generally gold or gold alloy) are located on top 50 and bottom 51 of the structure.

Figure 5:
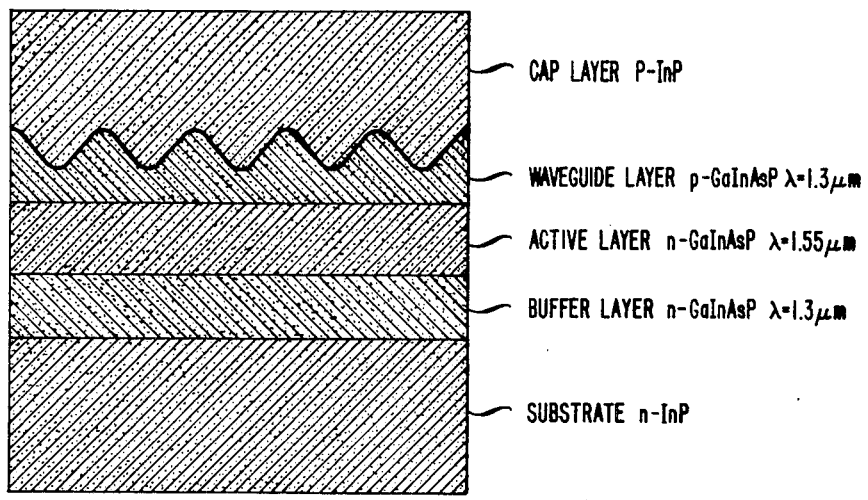
FIG. 5 shows a view of a distributed feedback semiconductor laser with grating in one of the epitaxial layers made in accordance with the invention.
Figure 6:
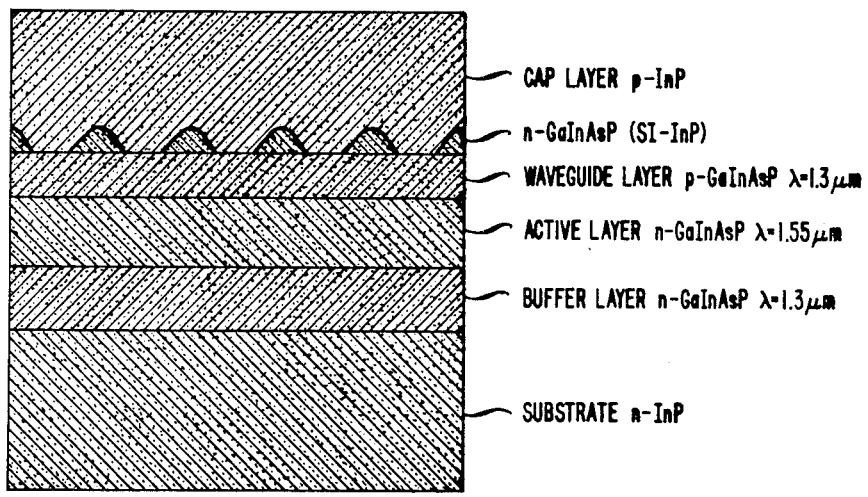
FIG. 6 shows a view of a distributed feedback semiconductor laser with grating composed of ridges made in accordance with the invention.

Other types of structures may be used. In particular, the grating may be located in other parts of the laser structure than the InP substrate. For example, it might be located in the cap layer above the top waveguide layer or in the top waveguide layer. A typical example is shown in FIG. 5. The grating may also be composed of a periodic array of ridges (say of n-type material such as n-GaInAsP or semi-insulating InP on p-type material). Here, the photoelectrochemical etching is carried out until only ridges (corresponding to the dark parts of the diffraction pattern) remain on the p-layer. An example is shown in FIG. 6.

A fabrication procedure for a typical structure is as follows: First, a grating is etched into an InP substrate in accordance with the invention. The orientation of the grating lines is along the [01$\bar{1}$] crystal direction, and their spacing is approximately 0.464 $\mu$m. This results in a second order distributed feedback grating. The InP substrate is then cleaned and loaded into the liquid phase epitaxial growth system, where a conventional doubly cladded double heterostructure is grown over it. Before the epitaxial growth, the wafer surface is protected by a Sn-InAs-InP solution which supplied overpressures of both As and P. The geometry is the same previously reported for wafer protection using a Sn solution saturated with only InP. (See, for example, P. Besomi et al, *Journal of Applied Physics*, 54(2), 535–539 (1983). The presence of the As in the vapor has been noted to enhance the protection of the grating etched surface, minimizing the redistribution of InP which washes out the grating. The double heterostructure growth is performed at a temperature of approximately 632 degrees C., and consists of five layers as follows: first, a 1.3 $\mu$m wavelength lower waveguiding layer (n-type) which covers the grating surface and planarizes the wafer with a thickness of approximately 0.15 $\mu$m; second, a 1.55 $\mu$m wavelength active layer (undoped) with a thickness of approximately 0.15 $\mu$m; third, a 1.3 $\mu$m wavelength upper waveguiding (and anti-meltback) layer (p-type) with a thickness of approximately 0.15 $\mu$m; fourth, the InP cladding layer (p-type) with a thickness of approximately 0.5 $\mu$m; and fifth, a 1.2 $\mu$m wavelength layer for surface protection with a thickness of approximately 0.5 $\mu$m. The surface protection layer is removed after growth. The double heterostructure wafer is tested at this point to determine its suitability for further processing by optically pumping a small slice to lasing and investigating its lasing spectrum. Acceptable wafers must indicate lasing in a DFB mode (identifiable by its relatively narrow spectral width). This technique is also used to identify the proper grating spacing for the double heterostructure by measurement of the far field emission of the first order scattering (approximately perpendicular to the active layer) from the lasing mode.

Following this step, the DFB double heterostructure is processed for double channel planar buried heterostructure (DCPBH) lasers. This processing includes masking with SiO$_2$, double channel etching, and DCPBH regrowth, and also metallization and cleaving of the wafer into finished chips. The length of the finished devices was 250 $\mu$m.

What is claimed is:

1. A process for making a device comprising a pattern on a semiconductor surface in which said pattern is an optical grating consisting of an array of parallel lines of light with periodicity of less than 5.0 $\mu$m and is made by a procedure comprising the step of photoelectrochemically etching at least part of the surface of the semiconductor to produce oxidized species by passing current through the semiconductor, an electrolytic solution and a cathode, said electrolytic solution comprising an aqueous solution of at least one acid selected from the group consisting of HCl, HBr and H$_2$SO$_4$ with a total acid concentration ranging from 1 to 5 molar and a conductivity greater than 0.0001 mhos/cm in which the step further comprises:
    a. applying a potential to the semiconductor between the maximum potential of the valence band of the semiconductor in the electrolytic solution and the minimum potential of the conduction band of the semiconductor in the electrolytic solution;
    b. illuminating the part of the surface of the semiconductor to be etched with radiation of sufficient energy to produce holes in the valence band;
    c. including in the composition of the electrolytic solution species which removes the oxidized species from the surface of the semiconductor.

2. The process of claim 1 in which the periodicity is less than 1.0 $\mu$m.

3. The process of claim 2 in which the periodicity is less than 0.5 $\mu$m.

4. The process of claim 1 in which the array of parallel lines of light is a light interference pattern.

5. The process of claim 1 in which the semiconductor is n-type.

6. The process of claim 1 in which the semiconductor is InP or semiconducting compound which is lattice matched to InP.

7. The process of claim 6 in which the potential varies from −0.5 volts to +1.0 volts on the SCE scale.

8. The process of claim 7 in which the potential varies from −0.1 volts to +0.5 volts on the SCE scale.

9. The process of claim 1 in which the acid is $H_2SO_4$.

10. The process of claim 9 in which the electrolytic solution comprises in addition an oxidizing agent.

11. The process of claim 10 in which the oxidizing agent is peroxide.

12. The process of claim 1 in which the device is an optical, wavelength division multiplexer/demultiplexer.

13. The process of claim 1 in which the device is a distributed feedback semiconductor laser.

14. The process of claim 13 in which the laser comprises a substrate comprising n-InP and the grating is etched into the substrate in accordance with the invention.

15. The process of claim 14 in which the semiconductor laser has a double channel planar buried heterostructure with the following layers on top of the substrate: n-type InGaAsP, undoped layer of InGaAsP, p-type InGaAsp, p-type InP, n-type InP and p-type InGaAs.

16. The process of claim 13 in which the grating is located in one of the epitaxial layers lattice matched to the InP substrate.

17. The process of claim 16 in which the grating has a ribbed structure.

* * * * *